(12) United States Patent
McCollum

(10) Patent No.: US 9,484,904 B2
(45) Date of Patent: Nov. 1, 2016

(54) GATE BOOSTING TRANSMISSION GATE

(71) Applicant: Microsemi SoC Corporation, San Jose, CA (US)

(72) Inventor: John L. McCollum, Orem, UT (US)

(73) Assignee: MICROSEMI SOC CORPORATION, San Jose, CA (US)

( * ) Notice: Subject to any disclaimer, the term of this patent is extended or adjusted under 35 U.S.C. 154(b) by 0 days.

(21) Appl. No.: 14/703,720

(22) Filed: May 4, 2015

(65) Prior Publication Data

US 2015/0318853 A1   Nov. 5, 2015

Related U.S. Application Data

(60) Provisional application No. 61/988,598, filed on May 5, 2014.

(51) Int. Cl.
*H03K 17/687* (2006.01)
*H03K 17/0412* (2006.01)
*H01L 27/092* (2006.01)

(52) U.S. Cl.
CPC ..... *H03K 17/04123* (2013.01); *H01L 27/0922* (2013.01); *H03K 17/6872* (2013.01); *H03K 2217/0054* (2013.01)

(58) Field of Classification Search
USPC .................................................. 327/365–508
See application file for complete search history.

(56) References Cited

U.S. PATENT DOCUMENTS

| | | | | |
|---|---|---|---|---|
| 4,571,504 A * | 2/1986 | Iwamoto | ............ | H03K 3/3565 327/206 |
| 5,955,912 A * | 9/1999 | Ko | ........ | H03K 17/693 326/113 |
| 5,973,518 A * | 10/1999 | Vallancourt | ............ | G11C 27/02 327/94 |
| 6,404,237 B1 * | 6/2002 | Mathew | ............... | H03K 17/063 326/106 |
| 7,199,641 B2 * | 4/2007 | Wei | ........ | H02M 3/073 327/293 |
| 7,664,599 B2 * | 2/2010 | Yamamoto | ............. | G01C 21/26 348/113 |
| 8,461,905 B2 * | 6/2013 | Krauss | ............ | H03K 17/04106 327/389 |
| 2007/0001743 A1 * | 1/2007 | Wei | ........ | H02M 3/073 327/427 |
| 2007/0126486 A1 * | 6/2007 | Lee | ........ | H03K 3/012 327/218 |
| 2012/0013391 A1 * | 1/2012 | Krauss | ............ | H03K 17/04106 327/437 |
| 2012/0025896 A1 * | 2/2012 | Yu | ........ | H03K 17/693 327/436 |

\* cited by examiner

*Primary Examiner* — Brandon S Cole

(74) *Attorney, Agent, or Firm* — Kenneth D'Alessandro; Leech Tishman Fuscaldo & Lampl

(57) ABSTRACT

A gate-boosting transmission gate includes an input node and an output node. An n-channel transistor has a first source/drain terminal connected to the input node and a second source/drain terminal connected to the output node, the n-channel transistor having a low threshold. A p-channel transistor has a first source/drain terminal connected to the input node and a second source/drain terminal connected to the output node, the p-channel transistor having a very low threshold.

6 Claims, 1 Drawing Sheet

Both Transistors Overdriven

GATE BOOSTING TRANSMISSION GATE

CROSS-REFERENCE TO RELATED APPLICATIONS

This application claims the benefit of U.S. Provisional Patent Application No. 61/988,598, filed May 5, 2014, the contents of which are incorporated in this disclosure by reference in their entirety.

BACKGROUND OF THE INVENTION

1. Field of the Invention

The present invention relates to integrated circuit technology. More particularly, the present invention relates to transmission gates and to gate boosting transmission gates.

2. Description of Related Art

As integrated circuits such as field-programmable gate array (FPGA) integrated circuits scale, the ability to overdrive n-channel pass gates is being severely compromised. Because of this limitation, it becomes advantageous to begin to use CMOS transmission gates even though they consume more area.

CMOS transmission gates can be speeded up by slightly overdriving the gates of the transistors used to form the transmission gates. Providing the positive voltage for overdriving the gates of the n-channel transistors is relatively simple, but providing the negative bias to overdrive the gates of the p-channel transistors is difficult. As a result, it has been proposed to only overdrive the gates of the n-channel transistors.

FIG. 1 is a schematic diagram that illustrates the problem solved by the present invention. FIG. 1 shows a typical transmission gate 10 including an n-channel transistor 12 and a p-channel transistor 14. Both n-channel transistor 12 and p-channel transistor 14 are low-threshold devices. While the term "low-threshold" is somewhat relative, depending on the process node and speed/power tradeoff made as engineering decisions, a low-threshold device may have a $V_t$ (gate-to-source) of about 0.25V.

At the input node 16 of the transmission gate 10, one source/drain terminal of the n-channel transistor 12 is connected to one source/drain terminal of the p-channel transistor 14. At the output node 18 of the transmission gate 10, the other source/drain terminal of the n-channel transistor 12 is connected to the other source/drain terminal of the p-channel transistor 14.

The gates of the n-channel transistor 12 and the p-channel transistor 14 in the transmission gate 10 are driven from a latch 20 formed from a pair of inverters 22 and 24. The output of inverter 22 drives the input of inverter 24 and the output of inverter 24 drives the input of inverter 22. The circuit node comprising the output of inverter 22 and the input of inverter 24 is connected to the gate of the n-channel transistor 12 and the circuit node comprising the output of inverter 24 and the input of inverter 22 is connected to the gate of the p-channel transistor 14. The "high" state output of the latch is $V_{DD}$, and the "low" state output of the latch is normally ground. The latch can be written to control the state of the transmission gate.

As shown in FIG. 1, in order to overdrive the input of n-channel transistor 12, a voltage of $V_{DD}$+0.2 V is supplied to its gate. This voltage is relatively easy to provide at the outputs of the inverters 22 and 24 in the latch by slightly raising the power supply voltage to the inverters. In order to overdrive the input of p-channel transistor 14, a voltage of ground −0.2 V is supplied to its gate. This voltage is not easy to provide at the outputs of the inverters 22 and 24 since it requires providing a negative voltage supply on the integrated circuit. Providing a negative power supply voltage complicates the design of the integrated circuit.

SUMMARY OF THE INVENTION

In accordance with the present invention, the gates of the P-Channel transistors can be overdriven simply by providing P-Channel transistors having a lower $V_t$.

BRIEF DESCRIPTION OF THE DRAWING(S)

DESCRIPTION OF THE INVENTION

In the following description, numerous specific details are set forth in order to provide a more thorough description of the present invention. It will be apparent, however, to one skilled in the art, that the present invention may be practiced without these specific details. Other embodiments of the invention will readily suggest themselves to such skilled persons having the benefit of this disclosure. In some instances, well-known features have not been described in detail so as not to obscure the invention.

Figure 1:
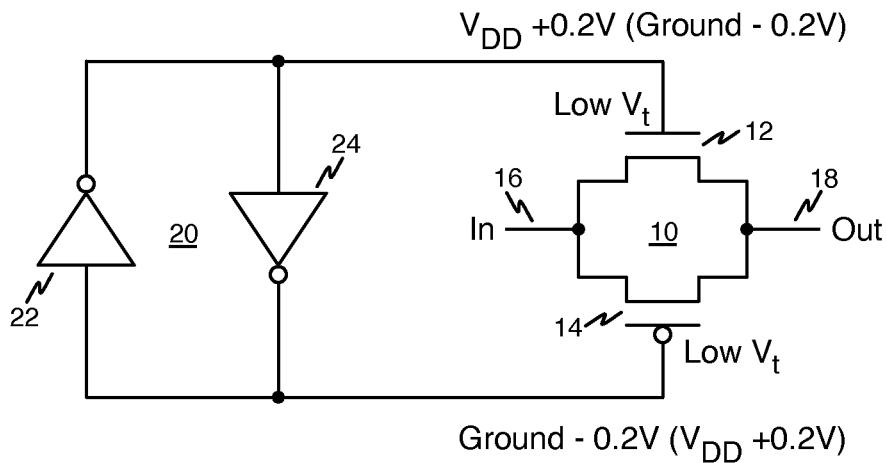
FIG. 1 is a schematic diagram of a prior-art transmission gate.
Figure 2:
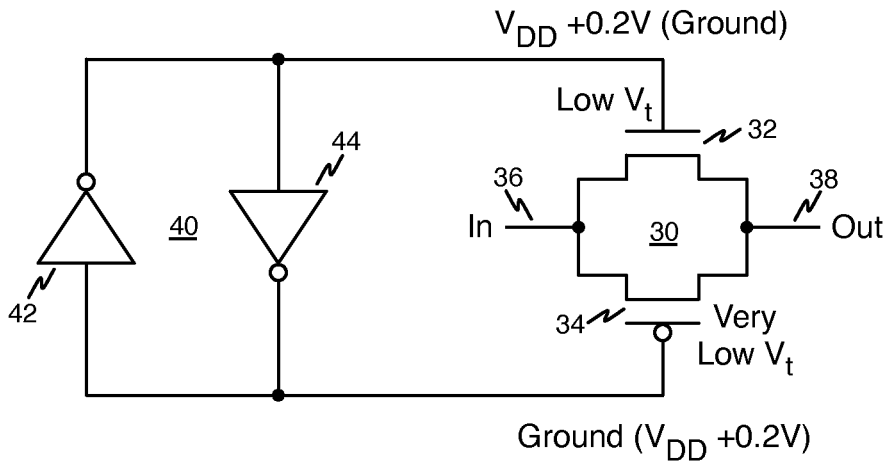
FIG. 2 is a schematic diagram of a transmission gate in accordance with the present invention.

Referring now to FIG. 2, a schematic diagram shows a transmission gate 30 in accordance with the present invention. Transmission gate 30 includes an n-channel transistor 32 and a p-channel transistor 34. N-channel transistor 32 is a low-threshold device (e.g., having a $V_t$ (gate-to-source) of about 0.25V, assuming a $V_{DD}$ power supply voltage of about 0.9V). P-channel transistor 34 is a very-low-threshold device. While the term "very-low-threshold" is also somewhat relative, depending on the process node and speed/power tradeoff made as engineering decisions, a very-low-threshold device may have a $V_t$ (gate-to-source) of about 0.15V, assuming a $V_{DD}$ power supply voltage of about 0.9V. Persons of ordinary skill in the art recognize that using a lower threshold p-channel transistor results in higher leakage than would normally be tolerated. This is countered in accordance with the present invention by taking the gate voltage of the device above $V_{DD}$ in the off state. Persons of ordinary skill in the art will also appreciate that the terms "low" and "very low" as applied to transistor thresholds will vary as a function of process node, supply voltage, and transistor design, and such skilled persons will readily be able to scale the "low" and "very low" threshold voltages according to the present invention as a function of these parameters.

One source/drain terminal of the n-channel transistor 32 is connected to one source/drain terminal of the p-channel transistor 34 and forms an input node 36 of the transmission gate 30. The other source/drain terminal of the n-channel transistor 32 is connected to the other source/drain terminal of the p-channel transistor 34 and forms the output node 38 of the transmission gate 30. The gates of the n-channel transistor 32 and the p-channel transistor 34 in the transmission gate 30 are driven from a latch 40 formed from a pair of inverters 42 and 44. The latch can be written to control the state of the transmission gate. The output of inverter 42 drives the input of inverter 44 and the output of inverter 44 drives the input of inverter 42. The circuit node comprising the output of inverter 42 and the input of inverter 44 is connected to the gate of the n-channel transistor 32 and the circuit node comprising the output of inverter 44 and the input of inverter 42 is connected to the gate of the p-channel transistor 34.

N-channel transistor 32 is fabricated as a normal n-channel transistor for the process and circuits used in the integrated circuit. In order to overdrive the input of n-channel transistor 32, a voltage of $V_{DD}$+0.2 V is supplied to its gate. This voltage is relatively easy to provide on the integrated circuit.

In order to overcome the problems of the prior art, p-channel transistor 34 is fabricated as a very low $V_t$ device. By fabricating the p-channel transistor 34 as a very low $V_t$ device, it has extra drive when its gate is biased at ground. In addition, p-channel transistor 34 is turned off harder than normal when driven at $V_{DD}$+0.2V and thus does not become leaky.

By employing the very low $V_t$ p-Channel transistor 34 in the transmission gate 30, the transmission gate 30 has additional drive when biased at ground and turned on, but the extra 0.2 V overdrive when it is turned off does not cause the device to become leaky. By using this arrangement, the present invention provides the benefit of overdrive on both the n-channel and p-channel transistors without the need to employ any additional circuitry.

Although the above provides a full and complete disclosure of the preferred embodiments of the invention, various modifications, alternate constructions and equivalents will occur to those skilled in the art. Therefore, the above should not be construed as limiting the invention, which is defined by the claims.

The invention claimed is:

1. A gate-boosting transmission gate comprising:
   an input node;
   an output node;
   an n-channel transistor having a first source/drain terminal connected to the input node and a second source/drain terminal connected to the output node, the n-channel transistor having a low threshold; and
   a p-channel transistor having a first source/drain terminal connected to the input node and a second source/drain terminal connected to the output node, the p-channel transistor having a very low threshold.

2. The gate-boosting transmission gate of claim 1 wherein:
   the n-channel transistor has a threshold of about 0.25V; and
   the p-channel transistor has a threshold of about 0.15V.

3. The gate-boosting transmission gate of claim 1, further comprising:
   a latch including a first inverter having an input and an output; and a second inverter having an input connected to the output of the first inverter and an output connected to the input of the first inverter; and
   wherein the latch has complementary low and high output states, the high output state having a voltage level of about $V_{DD}$+0.25V, and the low output state having a voltage level of about ground.

4. A gate-boosting transmission gate comprising:
   an input node;
   an output node;
   an n-channel transistor having a first source/drain terminal connected to the input node and a second source/drain terminal connected to the output node, the n-channel transistor having a voltage threshold of a first voltage; and
   a p-channel transistor having a first source/drain terminal connected to the input node and a second source/drain terminal connected to the output node, the p-channel transistor having a voltage threshold of a second voltage lower than the first voltage.

5. The gate-boosting transmission gate of claim 4 wherein:
   the n-channel transistor has a threshold of about 0.25V; and
   the p-channel transistor has a threshold of about 0.15V.

6. The gate-boosting transmission gate of claim 4, further comprising:
   a latch including a first inverter having an input and an output; and a second inverter having an input connected to the output of the first inverter and an output connected to the input of the first inverter; and
   wherein the latch has complementary low and high output states, the high output state having a voltage level of about $V_{DD}$+0.25V, and the low output state having a voltage level of about ground.

\* \* \* \* \*